United States Patent
Nakaya

(10) Patent No.: US 9,106,231 B2
(45) Date of Patent: Aug. 11, 2015

(54) BIDIRECTIONAL BUFFER AND CONTROL METHOD THEREOF

(71) Applicant: Shogo Nakaya, Tokyo (JP)

(72) Inventor: Shogo Nakaya, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 14/363,839

(22) PCT Filed: Dec. 13, 2012

(86) PCT No.: PCT/JP2012/082318
§ 371 (c)(1),
(2) Date: Jun. 9, 2014

(87) PCT Pub. No.: WO2013/105388
PCT Pub. Date: Jul. 18, 2013

(65) Prior Publication Data
US 2014/0347095 A1    Nov. 27, 2014

(30) Foreign Application Priority Data

Jan. 11, 2012 (JP) .................................. 2012-003071

(51) Int. Cl.
| | | |
|---|---|---|
| *H03K 19/177* | (2006.01) | |
| *H01L 25/00* | (2006.01) | |
| *H03K 19/173* | (2006.01) | |
| *H03K 19/0185* | (2006.01) | |
| *H03K 19/094* | (2006.01) | |

(52) U.S. Cl.
CPC .... *H03K 19/1737* (2013.01); *H03K 19/018592* (2013.01); *H03K 19/09429* (2013.01)

(58) Field of Classification Search
None
See application file for complete search history.

(56) References Cited

U.S. PATENT DOCUMENTS

| | | | | |
|---|---|---|---|---|
| 5,996,039 A | * | 11/1999 | Lee ............................... | 710/316 |
| 7,463,055 B2 | * | 12/2008 | Ciccarelli et al. .............. | 326/38 |
| 7,683,674 B2 | * | 3/2010 | Ciccarelli et al. ............. | 326/113 |

FOREIGN PATENT DOCUMENTS

| | | |
|---|---|---|
| JP | 3-91319 A | 4/1991 |
| JP | 2001-77686 A | 3/2001 |
| JP | 2004-153690 A | 5/2004 |
| JP | 2005-101535 A | 4/2005 |
| JP | 2009-99206 A | 5/2009 |
| JP | 2010-109683 A | 5/2010 |
| WO | 2008/111406 A1 | 9/2008 |

OTHER PUBLICATIONS

International Search Report for PCT Application No. PCT/JP2012/082318, mailed on Mar. 5, 2013.

* cited by examiner

*Primary Examiner* — Anh Tran
(74) *Attorney, Agent, or Firm* — Sughrue Mion, PLLC

(57) ABSTRACT

Bidirectional buffer 20D includes: multiplexer 30 that is equipped with rewriteable variable-resistance nonvolatile switch elements for each input terminal; tristate buffer 51 that is equipped with rewriteable variable-resistance nonvolatile switch elements for each output terminal and that receives the output of multiplexer 30 as input; demultiplexer 31 that receives the output of tristate buffer 51 as input; programming transistor tr0 whose drain terminal is connected to the input terminal of tristate buffer 51; and programming transistor tr1 whose drain terminal is connected to the output terminal of tristate buffer 51. Input terminals i1 and i3 of multiplexer 30 are connected to respective output terminals t1 and t2 of demultiplexer 31.

10 Claims, 7 Drawing Sheets

BIDIRECTIONAL BUFFER AND CONTROL METHOD THEREOF

This application is a National Stage Entry of PCT/JP2012/082318 filed on Dec. 13, 2012, which claims priority from Japanese Patent Application 2012-003071 filed on Jan. 11, 2012, the contents of all of which are incorporated herein by reference, in their entirety.

TECHNICAL FIELD

The present invention relates to a bidirectional buffer, and more particularly relates to a bidirectional buffer that is equipped with rewriteable variable-resistance nonvolatile switching elements.

BACKGROUND ART

Bidirectional buffers are often used as circuits that connect or disconnect wires while buffering input signals.

FIG. 1 shows an example of a bidirectional buffer.

Referring to FIG. 1, bidirectional buffer 20A is inserted between wire 10_1 and wire 10_2. Bidirectional buffer 20A includes configuration memories 6_1 and 6_2 and tristate buffers 5_1 and 5_2.

Tristate buffers 5_1 and 5_2 each have input terminal x, output terminal y, and control terminal c. Output terminal Q of configuration memory 6_1 is connected to control terminal c of tristate buffer 5_1, and output terminal Q of configuration memory 6_2 is connected to control terminal c of tristate buffer 5_2.

Output terminal y of tristate buffer 5_1 is connected to input terminal x of tristate buffer 5_2, and the connection wire of these terminals is connected to one end of wire 10_1.

Output terminal y of tristate buffer 5_2 is connected to input terminal x of tristate buffer 5_1, and the connection wire of these terminals is connected to one end of wire 10_2.

Tristate buffer 5_1 is controlled in accordance with the output value (logic value) of configuration memory 6_1 that is supplied to control terminal c. When the logic value is "1," tristate buffer 5_1 supplies the signal that is applied to input terminal x from output terminal y while buffering the signal. When the logic value is "0," output terminal y of tristate buffer 5_1 enters a high-impedance state.

Tristate buffer 5_2 is controlled in accordance with the output value (logic value) of configuration memory 6_2 that is supplied to control terminal c. When the logic value is "1," tristate buffer 5_2 supplies the signal that is applied to input terminal x from output terminal y while buffering the signal. When the logic value is "0," output terminal y of tristate buffer 5_2 enters a high-impedance state.

In a state in which "1" is held in configuration memory 6_1, and "0" is held in configuration memory 6_2 in the above-described bidirectional buffer 20A, a signal that is received as input by way of wire 10_2 is transmitted to wire 10_1 while being buffered in tristate buffer 5_1.

In a state in which "1" is held in configuration memory 6_2 and "0" is held in configuration memory 6_1, a signal that is received by way of wire 10_1 is transmitted to wire 10_2 while being buffered in tristate buffer 5_2.

When "0" is held in both of configuration memories 6_1 and 6_2, bidirectional buffer 20A acts to disconnect both of wire 10_1 and wire 10_2.

As described hereinabove, bidirectional buffer 20A is able to change the propagation direction of the signal that is buffered and to disconnect wire 10_1 from 10_2 in accordance with the held content of configuration memories 6_1 and 6_2, i.e., the configuration data.

FIG. 2 shows the configuration of another bidirectional buffer. This bidirectional buffer 20B has the function of supplying the output signal of another circuit 2 to wire 10_1 or wire 10_2 while buffering the signal in addition to the function of bidirectional buffer 20A shown in FIG. 1.

Referring to FIG. 2, bidirectional buffer 20B has tristate buffers 5_1 and 5_2 and multiplexers 3_1 and 3_2. In FIG. 2, configuration memories 6_1 and 6_2 shown in FIG. 1 have been omitted.

Both of multiplexers 3_1 and 3_2 each have first and second input terminals, an output terminal, and control terminal s.

Control terminal s of multiplexer 3_1 and control terminal c of tristate buffer 5_1 are connected by way of wire 7_1 to output terminal Q of configuration memory 6_1 shown in FIG. 1.

Control terminal s of multiplexer 3_2 and control terminal c of tristate buffer 5_2 are connected by way of wire 7_2 to output terminal Q of configuration memory 6_2 shown in FIG. 1.

Output terminal y of tristate buffer 5_1 is connected to the first input terminal of multiplexer 3_2, and the connection wire of these terminals is connected to one end of wire 10_1. Output terminal y of tristate buffer 5_2 is connected to the first input terminal of multiplexer 3_1, and the connection wire of these terminals is connected to one end of wire 10_2.

The output terminal of multiplexer 3_1 is connected to input terminal x of tristate buffer 5_1, and the output terminal of multiplexer 3_2 is connected to input terminal x of tristate buffer 5_2. The output signal of circuit 2 is supplied to the second input terminals of each of multiplexers 3_1 and 3_2.

In bidirectional buffer 20B described above, according to configuration data supplied by way of wire 7_1 and 7_2, wire 10_1 is disconnected from wire 10_2, or a signal that is supplied to wire 10_1 or wire 10_2 is selected by multiplexers 3_1 and 3_2, and the signal that was selected is transmitted to wire 10_1 or 10_2 while being buffered by tristate buffer 5_1 or tristate buffer 5_2.

A large number of bidirectional buffers such as shown in FIG. 1 or FIG. 2 are used in, for example, buses that link macro-blocks together or in the programmable wire of reconfigurable circuits.

However, a problem arises in which, because each of the above-described bidirectional buffers uses two tristate buffers and configuration memories that take up a large area, the bidirectional buffer also takes up a large area. The large area of bidirectional buffers raises serious problems in circuits that employ a large number of bidirectional buffers.

In addition, the use of two tristate buffers having large parasitic capacitance raises the problem in which power consumed by the bidirectional buffer will increase. The increased power consumption of bidirectional buffers is a serious problem in circuits that employ a large number of bidirectional buffers.

Still further, the use of SRAM (Static Random Access Memory) as configuration memory necessitates the writing of configuration data to the memories each time the power is turned on. This writing of configuration data to memories requires a certain amount of time, and further, consumes considerable power.

As a means that can provide a solution to the above-described problems, there is a bidirectional buffer disclosed in Patent Literature 1 that is equipped with rewriteable variable-resistance nonvolatile switch elements.

FIG. 3 shows the configuration of the bidirectional buffer that is equipped with rewriteable variable-resistance nonvolatile switch elements.

Referring to FIG. 3, bidirectional buffer 20c has buffer 50, multiplexer 30, and demultiplexer 31. Buffer 50 has input terminal x and output terminal y.

Multiplexer 30 has first to third input terminals, three rewritable variable-resistance nonvolatile switches 1_1, 1_2, and 1_3, and an output terminal. In multiplexer 30, the first input terminal is connected to the output terminal by way of rewritable variable-resistance nonvolatile switch 1_1, the second input terminal is connected to the output terminal by way of rewritable variable-resistance nonvolatile switch 1_2, and the third input terminal is connected to the output terminal by way of rewritable variable-resistance nonvolatile switch 1_3.

Demultiplexer 31 has first and second output terminals, two rewritable variable-resistance nonvolatile switches 1_4 and 1_5, and an input terminal. In demultiplexer 31, the input terminal is connected both to the first output terminal by way of rewritable variable-resistance nonvolatile switch 1_4 and to the second output terminal by way of rewritable variable-resistance nonvolatile switch 1_5.

The first input terminal of multiplexer 30 is connected to the first output terminal of demultiplexer 31, and the connection wire of these terminals is connected to one end of wire 10_1. The third input terminal of multiplexer 30 is connected to the second output terminal of demultiplexer 31, and the connection wire of these terminals is connected to one end of wire 10_2. The output signal of circuit 2 is supplied to the second input terminal of multiplexer 30.

The output terminal of multiplexer 30 is connected to input terminal x of buffer 50. Output terminal y of buffer 50 is connected to the input terminal of demultiplexer 31.

In bidirectional buffer 20c described hereinabove, multiplexer 30 selects one signal from among a signal that is received by way of wire 10_1, a signal received by way of wire 10_2 and the output signal of circuit 2 and supplies the selected signal to buffer 50. Demultiplexer 31 further selects either wire 10_1 or wire 10_2 as the output destination of the signal from buffer 50.

The selection of input in multiplexer 30 is determined according to the conductive state of each of rewritable variable-resistance nonvolatile switches 1_1, 1_3, and 1_3. The selection of the output destination in demultiplexer 31 is determined according to the conductive state of each of rewritable variable-resistance nonvolatile switches 1_4 and 1_5.

FIG. 4 shows the configuration of a rewritable variable-resistance nonvolatile switch element.

Referring to FIG. 4, rewritable variable-resistance nonvolatile switch element 1 has a configuration in which ion-conductor 61 is sandwiched between first electrode 60 and second electrode 62. First electrode 60 is composed of a material that can be readily ionized such as Cu. Second electrode 62 is composed of a material that is difficult to ionize such as Ru.

When a voltage that is higher than that of second electrode 62 by a set voltage Vset is applied to first electrode 60 for a fixed time interval, a conductive state (switched ON state) is realized between first electrode 60 and second electrode 62. When voltage of the reverse direction is applied between first electrode 60 and second electrode 62 for a fixed time interval in this conductive state, first electrode 60 and second electrode 62 are disconnected from each other. This disconnection state is the switched OFF state.

Rewritable variable-resistance nonvolatile switch element 1 described above features nonvolatility whereby the immediately preceding state is held despite interruption of the power supply. As a result, the bidirectional buffer shown in FIG. 3 has the merit that configuration data need not be written each time power is turned on.

In addition, rewritable variable-resistance nonvolatile switch element 1 has the added advantage that parasitic capacitance is extremely low. As a result, increased power consumption by rewritable variable-resistance nonvolatile switch elements 1_1-1_5 does not pose a problem in the bidirectional buffer shown in FIG. 3.

Still further, because the bidirectional buffer shown in FIG. 3 has only one buffer, and further, does not require configuration memories, the bidirectional buffer has the merits of having a smaller circuit area and lower power consumption than the bidirectional buffer shown in FIG. 1 or FIG. 2.

CITATION LIST

Patent Literature

Patent Literature 1: International Publication WO2008/111406

SUMMARY OF THE INVENTION

Nevertheless, the bidirectional buffer shown in FIG. 3 is not equipped with a means for programming the rewritable variable-resistance nonvolatile switch elements and therefore cannot be put to actual use.

It is therefore an exemplary object of the present invention to provide a bidirectional buffer that can solve the above-described problem and in which rewritable variable-resistance nonvolatile switch elements can be programmed, a reconfigurable circuit that uses this bidirectional buffer, and a control method of the bidirectional buffer.

Means for Solving the Problem

According to one aspect of the invention for achieving the above-described objects, a bidirectional buffer is provided that includes:

a tristate buffer that supplies an input signal as output while buffering the input signal;

a multiplexer whose output terminal is connected to an input terminal of the tristate buffer;

a demultiplexer whose input terminal is connected to an output terminal of the tristate buffer;

a first programming transistor whose drain terminal is connected to the input terminal of the tristate buffer; and a second programming transistor whose drain terminal is connected to the output terminal of the tristate buffer;

wherein:

the multiplexer is equipped with a plurality of input terminals and a plurality of first switch elements provided for each of the input terminals;

the demultiplexer is equipped with a plurality of output terminals and a plurality of second switch elements provided for each of the output terminals;

at least two input terminals of the multiplexer are connected to at least two output terminals, respectively, of the demultiplexer, and the connection wires between the input terminals and the output terminals are connected to respectively different external wires;

a conductive state and nonconductive state of each of the first and second switch elements can be programmably set according to supplied voltage;

the first programming transistor switches between supplying and blocking of a supply of voltage to the plurality of first switch elements; and the second programming transistor switches between supplying and blocking of a supply of voltage to the plurality of second switch elements.

According to another aspect of the present invention, a reconfigurable circuit is provided that includes: the above-described bidirectional buffer;

a plurality of wires connected to the bidirectional buffer; and a plurality of programming transistors provided in each of the plurality of wires having drain terminals connected to the wires.

According to another aspect of the present invention, a control method of a bidirectional buffer is provided that is the control method of a bidirectional buffer that includes: a tristate buffer that supplies an input signal as output while buffering the input signal; a multiplexer whose output terminal is connected to an input terminal of the tristate buffer; a demultiplexer whose input terminal is connected to an output terminal of the tristate buffer; a first programming transistor whose drain terminal is connected to the input terminal of the tristate buffer; and a second programming transistor whose drain terminal is connected to the output terminal of the tristate buffer; wherein: the multiplexer is equipped with a plurality of input terminals and a plurality of first switch elements provided for each of the input terminals; the demultiplexer is equipped with a plurality of output terminals and a plurality of second switch elements provided for each of the output terminals; a conductive state and nonconductive state of each of the first and second switch elements can be programmably set according to supplied voltage, the immediately preceding set state being maintained when power supply is disconnected; at least two input terminals of the multiplexer are connected to at least two output terminals, respectively, of the demultiplexer; the connection wires between the input terminals and the output terminals are each connected to respectively different external wires; the control method including:

supplying a gate signal to the gate terminal of the first programming transistor to place the first programming transistor in the ON state, and supplying a programming voltage to the source terminal of the first programming transistor that has been placed in the ON state to place one switch element from among the plurality of first switch elements in the ON state; and supplying a gate signal to the gate terminal of the second programming transistor to place the second programming transistor in the ON state, and supplying the programming voltage to the source terminal of the second programming transistor that has been placed in the ON state to place at least one switch element from among the plurality of second switch elements in the ON state.

Effect of the Invention

According to the present invention, a bidirectional buffer can be provided that enables programming of rewritable variable-resistance nonvolatile switch elements.

Figure 1:
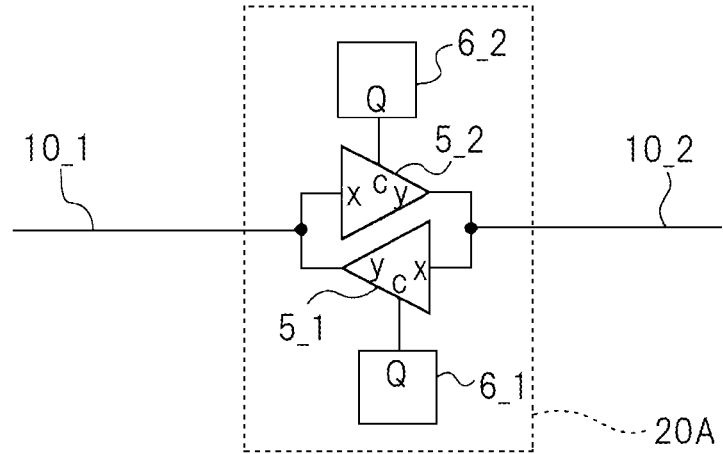
FIG. 1 is a circuit diagram of a bidirectional buffer that is related to the present invention.

EXPANATION OF REFERENCE NUMBER 1, 1_1-1_9 rewritable variable-resistance nonvolatile switch element
5, 51 tristate buffer
10_1-10_4 wires
20D, 20E bidirectional buffer
30 multiplexer
31 demultiplexer
40_1, 40_2 transmission gate
50 buffer
55 AND gate
c control terminal (or control signal)
g0-g5 gate terminal
p0-p5 source terminal
tr0-tr5 programming transistor
tr6, tr8 NMOS transistor
tr7, tr9 PMOS transistor
u signal
x, i1-i5, t input terminal
y, i, t1-t4 output terminal
Exemplary Embodiment Exemplary embodiments of the present invention are next described with reference to the accompanying drawings.

First Exemplary Embodiment

Figure 5:
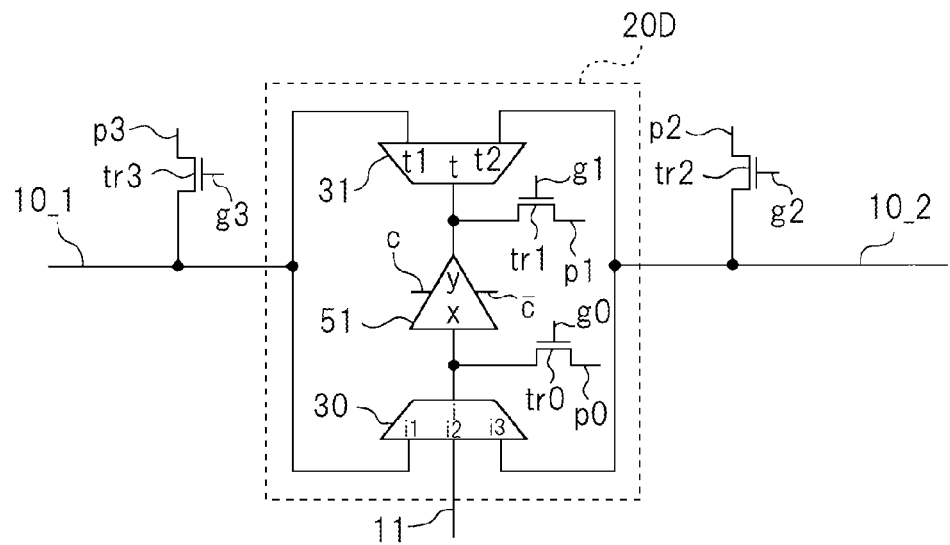
FIG. 5 is a circuit diagram of a bidirectional buffer that is the first exemplary embodiment of the present invention.

FIG. 5 is a circuit diagram showing the configuration of the bidirectional buffer that is the first exemplary embodiment of the present invention.

Bidirectional buffer 20D is inserted between wire 10_1 and wire 10_2.

Bidirectional buffer 20D, in accordance with a configuration, executes any of the four processes of:

(1) transmitting a signal from wire 10_1 to wire 10_2 while buffering the signal;

(2) conversely, transmitting a signal from wire 10_2 to wire 10_1 while buffering the signal;

(3) disconnecting wire 10_1 from wire 10_2; and (4) buffering and supplying signal 11 from another circuit (not shown in FIG. 5) to wire 10_1 or wire 10_2. The process of (4) may be a process of simultaneously buffering and supplying signal 11 to both wire 10_1 and wire 10_2.

Bidirectional buffer 20D includes multiplexer 30, demultiplexer 31, programming-compatible tristate buffer 51, and programming transistors tr0 and tr1.

Programming-compatible tristate buffer 51 includes input terminal x, output terminal y, and control terminals c and/c. "/c" signifies the inverted input of the control signal that is supplied to control terminal c. Here, the control signal is given by the logic value of "1" or "0," and the inverted input is applied by inverting the logic of the control signal.

Multiplexer 30 has three input terminals i1, i2, and i3, and output terminal i. Multiplexer 30 selects any of the input terminals i1, i2, and i3 according to the configuration, and supplies signal that is supplied to the selected input terminal to output terminal i.

Demultiplexer 31 has input terminal t and two output terminals t1 and t2 each of which supplies the signal that was supplied to input terminal t or enters a high impedance state in accordance with the configuration.

Output terminal i of multiplexer 30 is connected to input terminal x of programming-compatible tristate buffer 51, and the connection wire of these terminals is connected to the drain terminal of programming transistor tr0. Output terminal y of programming-compatible tristate buffer 51 is connected to input terminal t of demultiplexer 31, and the connection wire of these terminals is connected to the drain terminal of programming transistor tr1.

Input terminal i1 of multiplexer 30 is connected to output terminal t1 of demultiplexer 31, and the connection wire of these terminals is connected to one end of wire 10_1. Input terminal i3 of multiplexer 30 is connected to output terminal t2 of demultiplexer 31, and the connection wire of these terminals is connected to one end of wire 10_2.

Signal 11 from the outside circuit (not shown) is supplied to input terminal i2 of multiplexer 30.

The drain terminal of programming transistor tr3 is connected to wire 10_1 and the drain terminal of programming transistor tr2 is connected to wire 10_2. Here, programming transistors tr2 and tr3 do not make up bidirectional buffer 20D. Typically, separate from bidirectional buffer 20D, a multiplicity of rewritable variable-resistance nonvolatile switch elements are linked to wire 10_1 and 10_2, and these rewritable variable-resistance nonvolatile switch elements correspond to programming transistors tr2 and tr3. In other words, rather than newly providing programming transistors tr2 and tr3 for bidirectional buffer 20D, components that have already provided are appropriated.

The configurations of multiplexer 30, demultiplexer 31, and programming-compatible tristate buffer 51 are next described more concretely.

Figure 6:
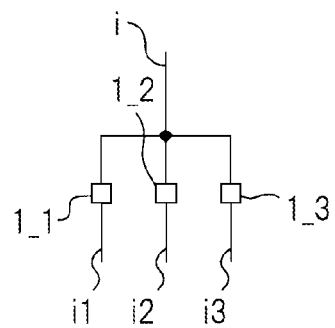
FIG. 6 is a circuit diagram showing an example of the multiplexer of the bidirectional buffer shown in FIG. 5.

FIG. 6 shows the configuration of multiplexer 30.

Figure 4:
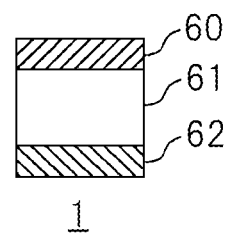
FIG. 4 is a schematic view showing an example of a rewritable variable-resistance nonvolatile switch element of the bidirectional buffer shown in FIG. 3.

Referring to FIG. 6, multiplexer 30 includes three rewritable variable-resistance nonvolatile switch elements 1_1, 1_2, and 1_3. Each of rewritable variable-resistance nonvolatile switch elements 1_1, 1_2, and 1_3 has a configuration in which an ion-conductor is sandwiched between first and second electrodes, as shown in FIG. 4.

The first electrode of rewritable variable-resistance nonvolatile switch element 1_1 is connected to input terminal i1, and the second electrode is connected to output terminal i. The first electrode of rewritable variable-resistance nonvolatile switch element 1_2 is connected to input terminal i2, and the second electrode is connected to output terminal i. The first electrode of rewritable variable-resistance nonvolatile switch element 1_3 is connected to input terminal i3, and the second electrode is connected to output terminal i.

The programming of rewritable variable-resistance nonvolatile switch elements 1_1, 1_2, and 1_3 to a desired ON/OFF state in multiplexer 30 is referred to as "configuration."

Figure 7:
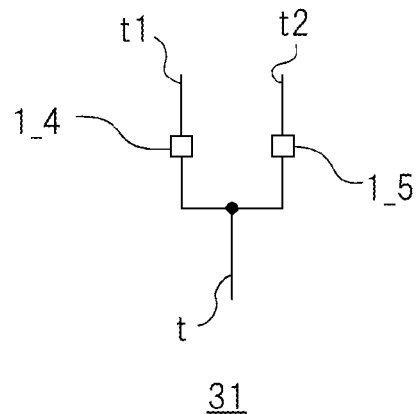
FIG. 7 is a circuit diagram showing an example of the demultiplexer of the bidirectional buffer shown in FIG. 5.

FIG. 7 shows the configuration of demultiplexer 31.

Referring to FIG. 7, demultiplexer 31 has two rewritable variable-resistance nonvolatile switch elements 1_4 and 1_5. Each of rewritable variable-resistance nonvolatile switch elements 1_4 and 1_5 has a construction in which an ion-conductor is sandwiched between first and second electrodes as shown in FIG. 4.

Output terminal t1 is connected to the first electrode of rewritable variable-resistance nonvolatile switch element 1_4, and output terminal t2 is connected to the first electrode of rewritable variable-resistance nonvolatile switch element 1_5. The second electrode of each of rewritable variable-resistance nonvolatile switch elements 1_4 and 1_5 is connected to input terminal t.

In demultiplexer 31, the programming of rewritable variable-resistance nonvolatile switch elements 1_4 and 1_5 to a desired ON/OFF state is referred to as "configuration."

Figure 8:
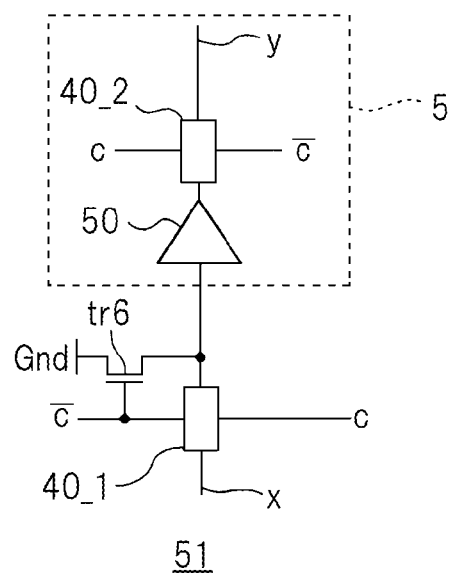
FIG. 8 is a circuit diagram showing an example of the programming-compatible tristate buffer of the bidirectional buffer shown in FIG. 5.

FIG. 8 shows the configuration of programming-compatible tristate buffer 51. In FIG. 8, "c" indicates a control signal, and "/c" indicates a signal for which the logic of the control signal has been inverted.

As shown in FIG. 8, programming-compatible tristate buffer 51 has tristate buffer 5, transmission gate 40_1, and fixed-logic-value transistor tr6.

Tristate buffer 5 is a component that operates in accordance with control signal c and that includes buffer 50 and transmission gate 40_2. The output terminal of buffer 50 is connected to output terminal y (output terminal y of programming-compatible tristate buffer 51 shown in FIG. 5) by way of transmission gate 40_2.

Transmission gate 40_2 operates in accordance with control signal c. More specifically, transmission gate 40_2 enters the switched-ON state when control signal c is "1." In this switched-ON state, the output of buffer 50 is transmitted to output terminal y.

On the other hand, transmission gate 40_2 enters the switched-OFF state when control signal c is "0." In this switched-OFF state, output terminal y enters a high-impedance state.

Input terminal x (input terminal x of programming-compatible tristate buffer 51 shown in FIG. 5) is connected to the input terminal of buffer 50 by way of transmission gate 40_1.

Fixed-logic-value transistor tr6 is an NMOS transistor in which the drain terminal is connected to the wire that connects transmission gate 40_1 and buffer 50, and the source terminal is grounded. Control signal/c is supplied to the gate terminal of fixed-logic-value transistor tr6.

In programming-compatible tristate buffer 51 shown in FIG. 8, the signal supplied to input terminal x is transmitted to output terminal y while being buffered when control signal c is "1."

In contrast, when control signal c is "0," the input/output of programming-compatible tristate buffer 51 both enter a high-impedance state. At this time, fixed-logic-value transistor tr6 that is controlled by control signal/c is in the ON state, whereby the input of buffer 50 is fixed at logic value "0" (GND level). As a result, the input of buffer 50 enters a floating state and the flow of a large through-current can be prevented.

Figure 9:
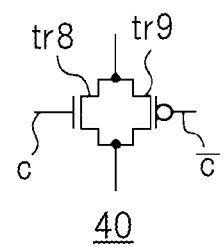
FIG. 9 is a circuit diagram showing an example of the transmission gate of the programming-compatible tristate buffer shown in FIG. 8.

FIG. 9 shows an example of transmission gate 40.

Referring to FIG. 9, transmission gate 40 is a component that is used as transmission gates 40_1 and 40_2 and includes NMOS transistor tr8 and PMOS transistor tr9.

The drain terminal of NMOS transistor tr8 is connected to the drain terminal of PMOS transistor tr9. The source terminal of NMOS transistor tr8 is connected to the source terminal of PMOS transistor tr9. Control signal c is supplied to the gate terminal of NMOS transistor tr8, and control signal/c is supplied to the gate terminal of PMOS transistor tr9.

In transmission gate 40, a conductive state is established across the source and drain of each of NMOS transistor tr8 and PMOS transistor tr9 when control signal c is "1" (control signal/c is "0"). On the other hand, a disconnection state is established across the source and drain of each of NMOS transistor tr8 and PMOS transistor tr9 when control signal c is "0" (control signal/c is "1").

High-withstand-voltage transistors that withstand the set voltage Vset of rewritable variable-resistance nonvolatile switch elements that make up multiplexer 30 and demultiplexer 31 can be used as NMOS transistor tr8 and PMOS transistor tr9. On the other hand, transistors that withstand power-supply voltage Vdd during normal operation may be used in buffer 50 shown in FIG. 8. The relation here is Vset>Vdd.

In bidirectional buffer 20D shown in FIG. 5, programming transistors tr0, tr1, tr2, and tr3 are transistors that are used when programming rewritable variable-resistance nonvolatile switch elements. Although a programming transistor is not shown in the wiring by which signal 11 from another circuit is supplied in FIG. 5, the use of a programming transistor in the other circuit is assumed.

The operation of bidirectional buffer 20D is next described with reference to FIGS. 5 to 9.

Bidirectional buffer 20D is provided with two operation modes: configuration mode and normal operation mode.

When control signal c is "1" (control signal/c is "0"), bidirectional buffer 20D enters the configuration mode. At this time, input terminal x and output terminal y of programming-compatible tristate buffer 51 both enter the high-impedance state. In this state, multiplexer 30 and demultiplexer 31 are configured, i.e., the rewritable variable-resistance nonvolatile switch elements of each of multiplexer 30 and demultiplexer 31 are programmed.

In order to program a designated rewritable variable-resistance nonvolatile switch element in each of multiplexer 30 and demultiplexer 31, a gate signal for setting to the ON state is applied to two programming transistors that link the two electrodes of the rewritable variable-resistance nonvolatile switch element. A gate signal is applied to other programming transistors to place the transistors in the OFF state.

For example, in the case where a signal from wire 10_1 is transmitted to wire 10_2 while buffering, rewritable variable-resistance nonvolatile switch element 1_1 of multiplexer 30 is programmed, and further, rewritable variable-resistance nonvolatile switch element 1_5 of demultiplexer 31 is programmed.

In the case where rewritable variable-resistance nonvolatile switch element 1_1 of multiplexer 30 is programmed, gate signal g3 that indicates a logic value "1" is supplied to programming transistor tr3 and gate signal g0 that indicates a logic value "1" is supplied to programming transistor tr0. A gate signal that indicates a logic value of "0" is supplied to the other programming transistors to place these transistors in the OFF state. The programming voltage is then applied over a predetermined time interval across source terminal p3 of programming transistor tr3 and source terminal p0 of programming transistor tr0.

For example, in rewritable variable-resistance nonvolatile switch element 1_1, when the electrode on the side linked to output terminal i is first electrode 60 shown in FIG. 4, and the electrode on the side linked to input terminal i1 is second electrode 62 shown in FIG. 4, in order to program rewritable variable-resistance nonvolatile switch element 1_1 to be in the ON state, a voltage (Vset+Vth) is applied for a predetermined time interval to source terminal p0 of programming transistor tr0 and 0V (GND potential) is applied for a predetermined time interval to source terminal p3 of programming transistor tr3. Here, Vth is the threshold value voltage of programming transistor tr0. At this time, the set voltage Vset is also brought to bear on input terminal x of programming-compatible tristate buffer 51. High-withstand voltage transmission gate 40_1 shown in FIG. 8 is provided to protect buffer 50 from this high voltage.

In the case where rewritable variable-resistance nonvolatile switch element 1_5 of demultiplexer 31 is programmed, gate signal g3 that indicates a logic value of "1" is supplied to programming transistor tr2, and gate signal g1 that indicates a logic value of "1" is supplied to programming transistor tr1. A gate signal that indicates a logic value of "0" is supplied to the other programming transistor to place this transistor in the OFF state. The programming voltage is then applied for a predetermined time interval across source terminal p2 of programming transistor tr2 and source terminal p1 of programming transistor tr1.

In the configuration of the above-described demultiplexer 31, the programming voltage is applied from programming transistor tr1. To prevent the collision of this applied programming voltage with the output of buffer 50, high-withstand voltage transmission gate 40_2 shown in FIG. 8 is provided.

In the case where a signal is transmitted from wire 10_2 to wire 10_3 while buffering, rewritable variable-resistance nonvolatile switch element 1_3 of multiplexer 30 is programmed, and rewritable variable-resistance nonvolatile switch element 1_4 of demultiplexer 31 is programmed. In this case, rewritable variable-resistance nonvolatile switch element 1_3 is selected by setting each of programming transistors tr0 and tr2 to be in the ON state, and rewritable variable-resistance nonvolatile switch element 1_4 is selected by setting each of programming transistors tr1 and tr3 to be in the ON state.

In the case where signal 11 is transmitted to wire 10_1 while buffering, rewritable variable-resistance nonvolatile switch element 1_2 of multiplexer 30 is programmed and rewritable variable-resistance nonvolatile switch element 1_4 of demultiplexer 31 is programmed. In this case, rewritable variable-resistance nonvolatile switch element 1_3 is selected by setting, to be in the ON state, each of programming transistor tr0 and programming transistors (not shown) that are connected to the wire by which signal 11 is supplied, and rewritable variable-resistance nonvolatile switch element 1_4 is selected by setting each of programming transistors tr1 and tr3 to be in the ON state.

In the case where signal 11 is transmitted to wire 10_2 while buffering, rewritable variable-resistance nonvolatile switch element 1_2 of multiplexer 30 is programmed and rewritable variable-resistance nonvolatile switch element 1_5 of demultiplexer 31 is programmed. In this case, rewritable variable-resistance nonvolatile switch element 1_3 is selected by setting, to be in the ON state, each of programming transistor tr0 and the programming transistors (not shown) that are connected to the wiring by which signal 11 is supplied. Rewritable variable-resistance nonvolatile switch element 1_5 is selected by setting each of programming transistors tr1 and tr2 to be in the ON state.

When the two wires are disconnected, all of rewritable variable-resistance nonvolatile switch elements 1_1-1_5 are set to be in the OFF state. In order to place in the OFF state rewritable variable-resistance nonvolatile switch elements that are in the ON state, for example, voltage of the reverse direction is applied for a fixed time interval across first electrode 60 and second electrode 62 in the rewritable variable-resistance nonvolatile switch elements shown in FIG. 4.

In demultiplexer 31, in the case where the output of programming-compatible tristate buffer 51 is supplied to wire 10_1 and 10_2 simultaneously, rewritable variable-resistance nonvolatile switch elements 1_4 and 1_5 are programmed. In this case, rewritable variable-resistance nonvolatile switch elements 1_4 and 1_5 are selected by placing each of programming transistors tr1, tr2, and tr3 in the ON state.

As described hereinabove, in bidirectional buffer 20D of the present exemplary embodiment, any rewritable variable-resistance nonvolatile switch element of multiplexer 30 can be programmed by using, for example, programming transistor tr0 and outside programming transistors tr2 and tr3 to apply/block the programming voltage to rewritable variable-resistance nonvolatile switch elements 1_1, 1_2, and 1_3 of multiplexer 30. In addition, any rewritable variable-resistance nonvolatile switch elements of demultiplexer 31 can be programmed by using programming transistor tr1 and outside programming transistors tr2 and tr3 to apply/block the programming voltage to rewritable variable-resistance nonvolatile switch elements 1_4 and 1_5 of demultiplexer 31. In this way, programming transistors tr0 and tr1 together with outside programming transistors (such as programming transistors tr2 and tr3) function as means for programming predetermined rewritable variable-resistance nonvolatile switch elements of each of multiplexer 30 and demultiplexer 31, whereby bidirectional buffer 20D can be set to a desired configuration.

In addition, bidirectional buffer 20D is equipped with high-withstand-voltage transmission gates 40_1 and 40_2 that protect each of the input and output of buffer 50 from the programming voltage, whereby destruction of circuits can be prevented at the time of configuration.

In addition, the provision of fixed-logic-value transistor tr6 can prevent variations in the input of buffer 50 at the time of configuration.

Bidirectional buffer 20D of the present exemplary embodiment described hereinabove is only an example of the present invention, and the configuration is open to modification as appropriate.

Figure 10:
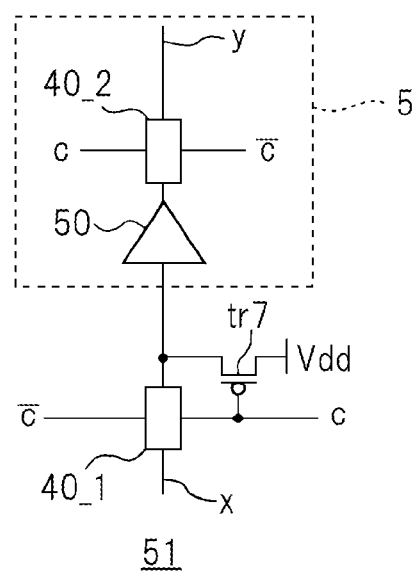
FIG. 10 is a circuit diagram showing another example of the programming-compatible tristate buffer of the bidirectional buffer shown in FIG. 5.

For example, programming-compatible tristate buffer 51 is not limited to the configuration shown in FIG. 8. Programming-compatible tristate buffer 51 may have a configuration such as shown in FIG. 10. In FIG. 10, "c" indicates a control signal, and "/c" signifies a signal in which the logic of the control signal has been inverted.

Programming-compatible tristate buffer 51 shown in FIG. 10 uses fixed-logic-value transistor tr7 in place of fixed-logic-value transistor tr6 shown in FIG. 8. Fixed-logic-value transistor tr7 is a PMOS transistor, its drain terminal being connected to the wiring that connects transmission gate 40_1 and buffer 50 and voltage Vdd is supplied to its source terminal. Control signal/c is supplied to the gate terminal of fixed-logic-value transistor tr7.

In the configuration mode in programming-compatible tristate buffer 51 shown in FIG. 8, the input of buffer 50 is fixed to a logic value of "0" by fixed-logic-value transistor tr6. In contrast, in the configuration mode in programming-compatible tristate buffer 51 shown in FIG. 10, the input of buffer 50 is fixed to a logic value of "1" by fixed-logic-value transistor tr7.

Figure 11:
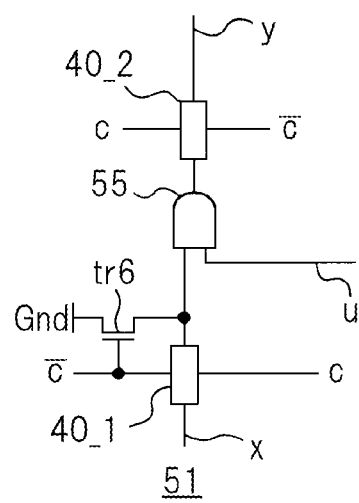
FIG. 11 is a circuit diagram showing yet another example of the programming-compatible tristate buffer of the bidirectional buffer shown in FIG. 5.

FIG. 11 shows another configuration of programming-compatible tristate buffer 51. In FIG. 11, "c" indicates the control signal, and "/c" signifies a signal in which the logic of the control signal has been inverted. "u" is a signal supplied from another circuit.

Programming-compatible tristate buffer 51 shown in FIG. 11 uses AND gate 55 in place of buffer 50 shown in FIG. 8. One of the input terminals of AND gate 55 is connected to the output terminal of transmission gate 40_1, and the drain terminal of fixed-logic-value transistor tr6 is connected to the connection wire of these terminals. Signal u is supplied to the other input terminal of AND gate 55. The output terminal of AND gate 55 is connected to the input terminal of transmission gate 40_2.

In programming-compatible tristate buffer 51 shown in FIG. 11, AND gate 55 carries out a logic operation of the output value of transmission gate 40_1 and signal u, and in accordance with the result of the operation, determines the output value of transmission gate 40_2 (the output value from output terminal y of programming-compatible tristate buffer 51).

In programming-compatible tristate buffer 51 shown in FIG. 11, any logic circuit that operates at power-supply voltage Vdd during normal operation can be used in place of AND gate 55.

Figure 12:
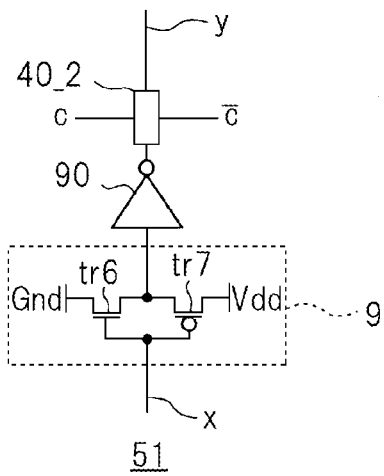
FIG. 12 is a circuit diagram showing another example of the programming-compatible tristate buffer of the bidirectional buffer shown in FIG. 5.

FIG. 12 shows yet another configuration of programming-compatible tristate buffer 51. In FIG. 11, "c" indicates the control signal, and "/c" signifies a signal in which the logic of the control signal is inverted.

Programming-compatible tristate buffer 51 shown in FIG. 12 has inverter 90 and high-withstand-voltage inverter 9 in place of transmission gate 40_1 and buffer 50 shown in FIG. 8.

High-withstand-voltage inverter 9 is made up of an NMOS transistor similar to fixed-logic-value transistor tr6 shown in FIG. 8 (indicated by the same reference number tr6 in FIG. 12) and a PMOS transistor similar to fixed-logic-value transistor tr7 shown in FIG. 10 (indicated by the same reference number tr7 in FIG. 12). However, the power-supply voltage is Vdd.

The drain terminal of NMOS transistor tr6 is connected to the drain terminal of PMOS transistor tr7, and the input terminal of inverter 90 is connected to the wire connecting these terminals. The gate terminal of NMOS transistor tr6 is connected to the gate terminal of PMOS 15 transistor tr7, and input terminal x of programming-compatible tristate buffer 51 is connected to the wire connecting these terminals.

The output terminal of inverter 90 is connected to the input terminal of transmission gate 40_2.

In programming-compatible tristate buffer 51 shown in FIG. 12, NMOS transistor tr6 and PMOS transistor tr7 are both high-withstand-voltage transistors, and the circuit is therefore not destroyed despite the application of the programming voltage to input terminal x.

In addition, because the power-supply voltage is Vdd, the output voltage value of high-withstand-voltage inverter 9 is within the range of 0V to Vdd, whereby inverter 90 does not suffer any breakdown. In the example of this configuration, the output of high-withstand-voltage inverter 9 is not prone to variation, and the logic-value-fixing function is therefore unnecessary.

Second Exemplary Embodiment

In the first exemplary embodiment described hereinabove, a configuration was described in which two wires, wire 10_1 and wire 10_2 are connected as wiring that can buffer and transmit signals bidirectionally, but the present invention is not limited to this form. The number of wires that can buffer and transmit signals bidirectionally may be three or more.

A bidirectional buffer in which four wires are connected as wiring that can buffer and transmit signals bidirectionally is next described as the second exemplary embodiment of the present invention.

Figure 13:
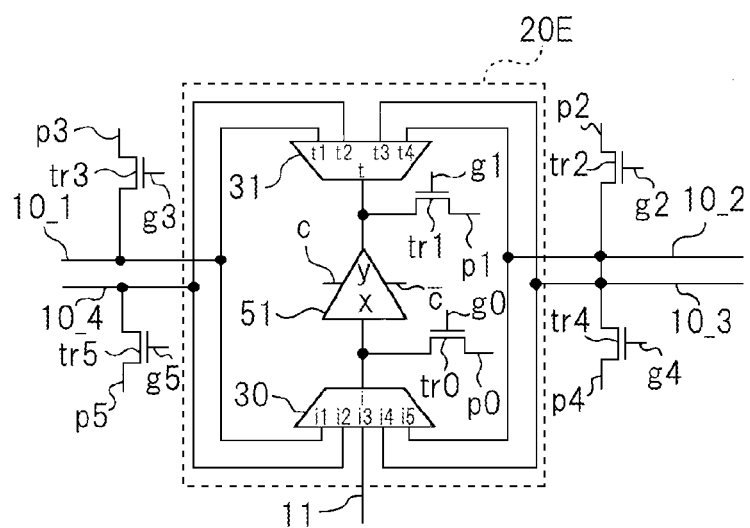
FIG. 13 is a circuit diagram of the bidirectional buffer that is the second exemplary embodiment of the present invention.

FIG. 13 is a circuit diagram that shows the configuration of the bidirectional buffer that is the second exemplary embodiment of the present invention. In FIG. 13, "c" indicates a control terminal or control signal, and "/c" signifies the inverted input of control signal c. Here, the control signal is given by a logic value of "1" or "0," and the inverted input is applied by inverting the logic of this control signal.

Bidirectional buffer 20E shown in FIG. 13 is connected to four wires 10_1-10_4 as wiring that can buffer and transmit signals bidirectionally.

According to this configuration, bidirectional buffer 20E executes any of the four processes of:

(1) while buffering, transmitting a signal from one wire to the other of two wires selected from among wire 10_1-10_4;

(2) conversely, while buffering, transmitting a signal from the other wire to the wire;

(3) disconnecting the wires; and (4) while buffering signal 11 from an outside circuit (not shown in the figure), supplying signal 11 to one wire from among wires 10_1-10_4 or simultaneously supplying signal 11 to two or more wires from among wires 10_1-10_4.

Referring to FIG. 13, bidirectional buffer 20E has: multiplexer 30, demultiplexer 31, programming-compatible tristate buffer 51, and programming transistors tr0 and tr1. Programming-compatible tristate buffer 51 and programming transistors tr0 and tr1 are the same as the components described in the first exemplary embodiment.

Multiplexer 30 has five input terminals i1, i2, i3, i4, and i5 and output terminal i, and according to the configuration, selects any of input terminals i1-i5 and transmits the signal supplied to the selected input terminal to output terminal i.

Demultiplexer 31 has input terminal t and four output terminals t1, t2, t3, and t4, and, according to the configuration, each of output terminals t1-t4 either supplies the signal that is supplied to input terminal t or enters a high-impedance state.

Output terminal i of multiplexer 30 is connected to input terminal x of programming-compatible tristate buffer 51, and the drain terminal of programming transistor tr0 is connected to the wire connecting these terminals. Output terminal y of programming-compatible tristate buffer 51 is connected to input terminal t of demultiplexer 31, and the drain terminal of programming transistor tr1 is connected to the wire connecting these terminals.

Input terminal i1 of multiplexer 30 is connected to output terminal t1 of demultiplexer 31, and one end of wire 10_1 is connected to the wire connecting these terminals. Input terminal i2 of multiplexer 30 is connected to output terminal t2 of demultiplexer 31, and one end of wire 10_4 is connected to the wire connecting these terminals.

Input terminal i4 of multiplexer 30 is connected to output terminal t3 of demultiplexer 31, and one end of wire 10_3 is connected to the wire connecting these terminals. Input terminal i5 of multiplexer 30 is connected to output terminal t4 of demultiplexer 31, and one end of wire 10_2 is connected to the wire connecting these terminals.

Signal 11 from an outside circuit (not shown) is supplied to input terminal i3 of multiplexer 30.

The drain terminal of programming transistor tr3 is connected to wire 10_1, and the drain terminal of programming transistor tr2 is connected to wire 10_2.

The drain terminal of programming transistor tr4 is connected to wire 10_3, and the drain terminal of programming transistor tr5 is connected to wire 10_4. Here, programming transistors tr2-tr5 do not make up bidirectional buffer 20E. Typically, a multiplicity of rewritable variable-resistance nonvolatile switch elements separate from bidirectional buffer 20E are linked to each of wires 10_1-10_4, and these elements correspond to programming transistors tr2-tr5. In other words, programming transistors tr2-tr5 are not components newly provided for bidirectional buffer 20E but are merely components originally provided in wires 10_1-10_4 and then appropriated.

The configurations of multiplexer 30 and demultiplexer 31 are next described more specifically.

Figure 14:
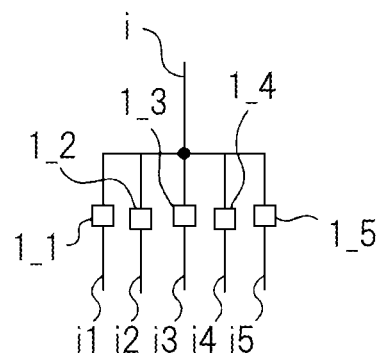
FIG. 14 is a circuit diagram showing an example of the multiplexer of the bidirectional buffer shown in FIG. 13.

FIG. 14 shows the configuration of multiplexer 30.

Multiplexer 30 shown in FIG. 14 has five rewritable variable-resistance nonvolatile switch elements 1_1-1_5.

Each of rewritable variable-resistance nonvolatile switch elements 1_1-1_5 has a construction in which an ion-conductor is sandwiched between a first electrode and a second electrode, such as shown in FIG. 4.

The first electrode of rewritable variable-resistance nonvolatile switch element 1_1 is connected to input terminal i1, and the second electrode is connected to output terminal i. The first electrode of rewritable variable-resistance nonvolatile switch element 1_2 is connected to input terminal i2, and the second electrode is connected to output terminal i. The first electrode of rewritable variable-resistance nonvolatile switch element 1_3 is connected to input terminal i3, and the second electrode is connected to output terminal i. The first electrode of rewritable variable-resistance nonvolatile switch element 1_4 is connected to input terminal i4, and the second electrode is connected to output terminal i. The first electrode of rewritable variable-resistance nonvolatile switch element 1_5 is connected to input terminal i5, and the second electrode is connected to output terminal i.

In multiplexer 30, configuration refers to programming rewritable variable-resistance nonvolatile switch elements 1_1-1_5 to the desired ON/OFF states.

Figure 15:
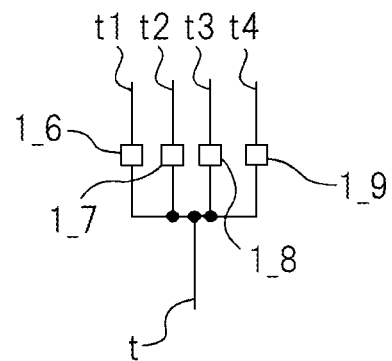
FIG. 15 is a circuit diagram showing an example of the demultiplexer of the bidirectional buffer shown in FIG. 13.

FIG. 15 shows the configuration of demultiplexer 31.

Demultiplexer 31 shown in FIG. 15 has four rewritable variable-resistance nonvolatile switch elements 1_6-1_9. Each of rewritable variable-resistance nonvolatile switch elements 1_6-1_9 has a construction in which an ion-conductor is sandwiched between a first electrode and a second electrode, such as shown in FIG. 4.

The first electrode of rewritable variable-resistance nonvolatile switch element 1_6 is connected to input terminal t, and the second electrode is connected to output terminal t1. The first electrode of rewritable variable-resistance nonvolatile switch element 1_7 is connected to input terminal t, and the second electrode is connected to output terminal t2. The first electrode of rewritable variable-resistance nonvolatile switch element 1_8 is connected to input terminal t, and the second electrode is connected to output terminal t3. The first electrode of rewritable variable-resistance nonvolatile switch element 1_9 is connected to input terminal t, and the second electrode is connected to output terminal t4.

In demultiplexer 31, configuration refers to programming rewritable variable-resistance nonvolatile switch elements 1_6-1_9 to desired ON/OFF states.

The operation of bidirectional buffer 20E of the present exemplary embodiment is next described.

Similar to the first exemplary embodiment, bidirectional buffer 20E is equipped with two operation modes: a configuration mode and a normal operation mode, the configuration mode being established when control signal c is "1" (control signal/c is "0"). At this time, input terminal x and output terminal y of programming-compatible tristate buffer 51 are both in the high-impedance state. In this state, multiplexer 30 and demultiplexer 31 are configured, i.e., each of the rewritable variable-resistance nonvolatile switch elements of multiplexer 30 and demultiplexer 31 is programmed.

In order to program a designated rewritable variable-resistance nonvolatile switch element in each of multiplexer 30 and demultiplexer 31, a gate signal is applied to a programming transistor that is connected to the two electrodes of the rewritable variable-resistance nonvolatile switch element in order to place the programming transistor in the ON state. A gate signal is applied to the other programming transistors in order to them in the OFF state.

For example, in the case where rewritable variable-resistance nonvolatile switch element 1_1 is programmed in multiplexer 30, gate signal g3 that indicates a logic value of "1" is supplied to programming transistor tr3, and gate signal g0 that indicates a logic value of "1" is supplied to programming transistor tr0. A gate signal that indicates a logic value of "0" is supplied to the other programming transistors to place them in the OFF state. The programming voltage is then applied over a predetermined time interval across source terminal p3 of programming transistor tr3 and source terminal p0 of programming transistor tr0.

In the case where rewritable variable-resistance nonvolatile switch element 1_2 is programmed, gate signal g5 that indicates a logic value of "1" is supplied to programming transistor tr5, and gate signal g0 that indicates a logic value of "1" is supplied to programming transistor tr0. A gate signal that indicates a logic value of "0" is supplied to the other programming transistors to place them in the OFF state. The programming voltage is then applied for a predetermined time interval across source terminal p5 of programming transistor tr5 and source terminal p0 of programming transistor tr0.

In the case where rewritable variable-resistance nonvolatile switch element 1_4 is programmed, gate signal g4 that indicates a logic value of "1" is supplied to programming transistor tr4, and gate signal g0 that indicates a logic value of "1" is supplied to programming transistor tr0. A gate signal that indicates a logic value of "0" is supplied to the other programming transistors to place them in the OFF state. The programming voltage is then applied for a predetermined time interval across source terminal p4 of programming transistor tr4 and source terminal p0 of programming transistor tr0.

In the case where rewritable variable-resistance nonvolatile switch element 1_5 is programmed, gate signal g2 that indicates a logic value of "1" is supplied to programming transistor tr2, and gate signal g0 that indicates a logic value of "1" is supplied to programming transistor tr0. A gate signal that indicates a logic value of "0" is supplied to the other programming transistors to place them in the OFF state. The programming voltage is then applied for a predetermined time interval across source p2 of programming transistor tr2 and source terminal p0 of programming transistor tr0.

In the case where rewritable variable-resistance nonvolatile switch element 1_6 is programmed in demultiplexer 31, gate signal g1 that indicates a logic value of "1" is supplied to programming transistor tr1, and gate signal g3 that indicates a logic value of "1" is supplied to programming transistor tr3. A gate signal that indicates a logic value of "0" is supplied to the other programming transistors to place them in the OFF state. The programming voltage is then applied for a predetermined time interval across source terminal p1 of programming transistor tr1 and source terminal p3 of programming transistor tr3.

In the case where rewritable variable-resistance nonvolatile switch element 1_7 is programmed, gate signal g1 that indicates a logic value of "1" is supplied to programming transistor tr1, and gate signal g5 that indicates a logic value of "1" is supplied to programming transistor tr5. A gate signal that indicates a logic value of "0" is supplied to the other programming transistors to place them in the OFF state. The programming voltage is then applied for a predetermined time interval across source terminal p1 of programming transistor tr1 and source terminal p5 of programming transistor tr5.

In the case where rewritable variable-resistance nonvolatile switch element 1_8 is programmed, gate signal g1 that indicates a logic value of "1" is supplied to programming transistor tr1, and gate signal g4 that indicates a logic value of "1" is supplied to programming transistor tr4. A gate signal that indicates a logic value "0" is supplied to the other programming transistors to place them in the OFF state. The programming voltage is then applied for a predetermined time interval across source terminal p1 of programming transistor tr1 and source terminal p4 of programming transistor tr4.

In the case where rewritable variable-resistance nonvolatile switch element 1_9 is programmed, gate signal g1 that indicates a logic value of "1" is supplied to programming transistor tr1, and gate signal g2 that indicates a logic value of "1" is supplied to programming transistor tr2. A gate signal that indicates a logic value of "0" is supplied to the other programming transistors to place them in the OFF state. The programming voltage is then applied for a predetermined time interval across source terminal p1 of programming transistor tr1 and source terminal p2 of programming transistor tr2.

In bidirectional buffer 20E of the present exemplary embodiment, any rewritable variable-resistance nonvolatile switch element of multiplexer 30 can be programmed by using programming transistor tr0 and, for example, outside programming transistors tr2-tr5 to apply/block the programming voltage to rewritable variable-resistance nonvolatile switch elements 1_1-1_5 of multiplexer 30. In addition, any rewritable variable-resistance nonvolatile switch element of demultiplexer 31 can be programmed by using programming transistor tr1 and, for example, outside programming transistors tr2-tr5 to apply/block the programming voltage to rewritable variable-resistance nonvolatile switch elements 1_6-1_9 of demultiplexer 31. In this way, programming transistors tr0 and tr1 together with outside programming transistors (such as programming transistors tr2-tr5) function as means for programming any rewritable variable-resistance nonvolatile switch element of each of multiplexer 30 and demultiplexer 31, whereby bidirectional buffer 20E can be set to the desired configuration.

In addition to the effects described in the first exemplary embodiment, bidirectional buffer 20E of the present exemplary embodiment features the following effects.

The number of programming transistors in bidirectional buffer 20E is only two regardless of the number of inputs and the number of outputs. Accordingly, the area overhead due to programming transistors becomes relatively smaller as the number of inputs and outputs increases (the increase in area due to increase of the number of rewritable variable-resistance nonvolatile switch elements is extremely small).

Figure 2:
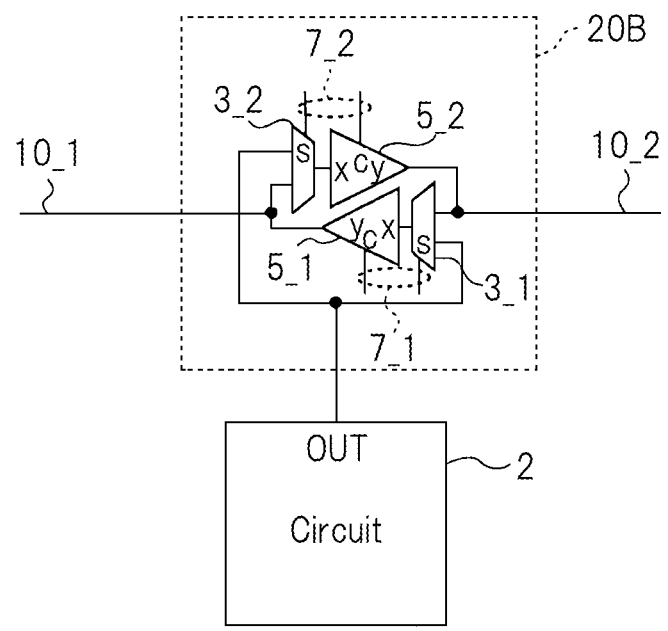
FIG. 2 is a circuit diagram of another bidirectional buffer that is related to the present invention.
Figure 3:
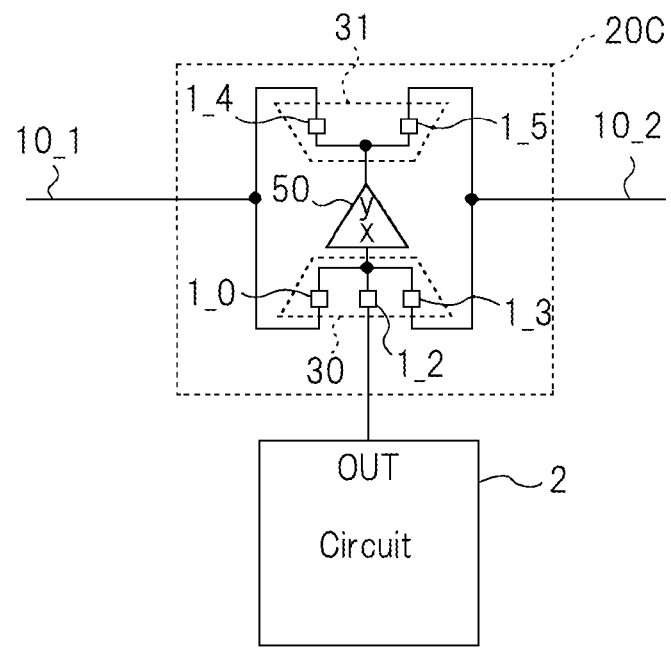
FIG. 3 is a circuit diagram of a bidirectional buffer equipped with rewritable variable-resistance nonvolatile switch elements that is related to the present invention.

In contrast, in the bidirectional buffer shown in FIG. 2, multiplexers 3_1 and 3_2 are constructions that select input by transistors, whereby the large increase in the number of transistors and wires that accompanies an increase in the number of inputs of multiplexers 3_1 and 3_2 raises the problem that there will be a rapid increase in the circuit area. The area of rewritable variable-resistance nonvolatile switch elements is extremely small compared to that of transistors, and a bidirectional buffer that uses rewritable variable-resistance nonvolatile switch elements can therefore limit an increase in the size of the circuit area despite increase in the number of inputs or the number of outputs.

In each of the above-described exemplary embodiments, the number of wires that can buffer and transfer signals bidirectionally may be any number equal to or greater than 2. In addition, the number of wires by which signal 11 from another circuit is supplied can be any number equal to or greater than 1. In addition, the wiring by which signal 11 is supplied from another circuit may be deleted.

As described hereinabove, the present invention enables the provision of a bidirectional buffer that allows programming of rewritable variable-resistance nonvolatile switch elements.

In addition, due to the use of a programming-compatible tristate buffer in which inputs and outputs are protected by high-withstand-voltage transistors, the programming voltage that is applied by way of programming transistors when the rewritable variable-resistance nonvolatile switch elements are being programmed is received by the high-withstand-voltage transistors. The buffer that is thus protected by high-withstand-voltage transistors does not suffer damage from the programming voltage.

The bidirectional buffer of the present invention can be used in a bus that links macro-blocks or in programmable wiring in a reconfigurable circuit. Because a large number of bidirectional buffers are used in a bus or in programmable wiring, the bidirectional buffer of the present invention that features a small area and nonvolatility is extremely useful in such applications.

The reconfigurable circuit described in Patent Literature 1 is one example of a reconfigurable circuit in which the bidirectional buffer of the present invention can be applied.

The reconfigurable circuit described in Patent Literature 1 includes a plurality of logic blocks and a programmable bus in which the connections of these logic blocks can be programmed. A programmable bus includes: a plurality of wires that are provided for each of the signal transmission ranges that are divided corresponding to the plurality of logic blocks and that connect together adjacent logic blocks; direct-wire connection switches that can be programmed to directly connect or disconnect the wires of the above-described adjacent transmission ranges; an input selector that is provided corresponding to each of the plurality of logic blocks, that is capable of programming the connection of any one wire from among the plurality of wires, and that supplies the signal of the wire that is connected to the logic blocks; and programmable switches that are provided for each of the signal transmission ranges and that can be programmed to connect or disconnect wires by way of a buffer corresponding to adjacent the signal transmission ranges for each of the plurality of wires. A plurality of the programmable switches is provided for at least one of the plurality of logic blocks.

In the above-described reconfigurable circuit, the bidirectional buffer of the present invention can be used as a programmable switch. In this case, the direct-wire connection switches are the programming transistors (programming transistors corresponding to, for example, tr2, tr3, tr4, and tr5 shown in FIG. 5 or FIG. 13).

The whole or part of the above-described exemplary embodiments can be described as, but not limited to, the following SUPPLEMENTARY NOTES 1-15.

(SUPPLEMENTARY NOTE 1)

A bidirectional buffer includes:

a tristate buffer that supplies an input signal as output while buffering the input signal;

a multiplexer whose output terminal is connected to an input terminal of the tristate buffer;

a demultiplexer whose input terminal is connected to an output terminal of the tristate buffer;

a first programming transistor whose drain terminal is connected to the input terminal of the tristate buffer; and a second programming transistor whose drain terminal is connected to the output terminal of the tristate buffer;

wherein:

the multiplexer is equipped with a plurality of input terminals and a plurality of first switch elements provided for each of the input terminals;

the demultiplexer is equipped with a plurality of output terminals and a plurality of second switch elements provided for each of the output terminals;

at least two input terminals of the multiplexer are connected to at least two output terminals, respectively, of the demultiplexer, and the connection wires between the input terminals and the output terminals are connected to respectively different external wires;

a conductive state and nonconductive state of each of the first and second switch elements can be programmably set according to supplied voltage;

the first programming transistor switches between supplying and blocking of a supply of voltage to the plurality of first switch elements; and the second programming transistor switches between supplying and blocking of a supply of voltage to the plurality of second switch elements.

(SUPPLEMENTARY NOTE 2) The bidirectional buffer as described in SUPPLEMENTARY NOTE 1, wherein:

the tristate buffer includes a logic circuit that operates at a first voltage and that supplies the input signal while buffering the input signal;

each of the first and second switch elements has two terminals, enters the conductive state when a second voltage that is greater than the value of the first voltage is applied across the two terminals for a predetermined time interval, and enters the nonconductive state when a reverse voltage whose direction is the reverse of the direction of the second voltage is applied for a predetermined time interval;

the first programming transistor switches between supplying and blocking of the supply of the second voltage and the reverse voltage to the plurality of first switch elements; and the second programming transistor switches between supplying and blocking of the supply of the second voltage and the reverse voltage to the plurality of second switch elements.

(SUPPLEMENTARY NOTE 3) The bidirectional buffer as described in SUPPLEMENTARY NOTE 2, wherein:

the tristate buffer further includes first and second transmission gates in which setting of the conductive state and nonconductive state is carried out according to control signals;

the first transmission gate is provided at the input stage of the logic circuit;

the second transmission gate is provided at the output stage of the logic circuit; and in a state in which each of the first and second transmission gates is set to the nonconductive state, the second voltage is supplied by way of the first programming transistor to one switch element from among the plurality of first switch elements, or the second voltage is supplied by way of the second programming transistor to at least one switch element from among the plurality of second switch elements.

(SUPPLEMENTARY NOTE 4) The bidirectional buffer as described in SUPPLEMENTARY NOTE 3, wherein the withstand voltage of the first and second transmission gates is equal to or greater than the second voltage.

(SUPPLEMENTARY NOTE 5) The bidirectional buffer as described in SUPPLEMENTARY NOTE 3 or 4, wherein each of the first and second transmission gates is each made up of an NMOS transistor and a PMOS transistor, the drain terminals of each being connected together, and moreover, the source terminals also being connected together;

the control signals include a first control signal and a second control signal in which the logic of the first control signal is inverted; and the first control signal is supplied to the gate terminal of the NMOS transistor and the second control signal is supplied to the gate terminal of the PMOS transistor.

(SUPPLEMENTARY NOTE 6) The bidirectional buffer as described in SUPPLEMENTARY NOTE 5, wherein the tristate buffer further includes an NMOS transistor for fixing the logic value, its drain terminal being connected to the output terminal of the first transmission gate, its gate terminal being connected to a wire to which the second control signal is supplied, and its source terminal being grounded.

(SUPPLEMENTARY NOTE 7) The bidirectional buffer as described in SUPPLEMENTARY NOTE 5, wherein the tristate buffer further includes a PMOS transistor for fixing the logic value, its drain terminal being connected to the output terminal of the first transmission gate, its gate terminal being connected to a wire to which the first control signal is supplied, and its source terminal being grounded.

(SUPPLEMENTARY NOTE 8) The bidirectional buffer as described in any one of SUPPLEMENTARY NOTES 2 to 7, wherein the logic circuit is a buffer.

(SUPPLEMENTARY NOTE 9) The bidirectional buffer as described in any one of SUPPLEMENTARY NOTES 3 to 7, wherein the logic circuit is an AND gate, one input terminal of the AND gate being connected to the output terminal of the first transmission gate, a signal that indicates the logic value from an outside circuit being supplied to the other input terminal of the AND gate, and the output terminal of the AND gate being connected to the input terminal of the second transmission gate.

(SUPPLEMENTARY NOTE 10) The bidirectional buffer as described in SUPPLEMENTARY NOTE 2, wherein:

the tristate buffer further includes a first inverter that is provided in the input stage of the logic circuit, the withstand voltage of which is equal to or greater than the value of the second voltage, and that operates at the first voltage; and the output terminal of the multiplexer is connected to the input terminal of the first inverter.

(SUPPLEMENTARY NOTE 11) The bidirectional buffer as described in SUPPLEMENTARY NOTE 10, wherein the logic circuit is made up of a second inverter having its input terminal connected to the output terminal of the first inverter.

(SUPPLEMENTARY NOTE 12) The bidirectional buffer as described in SUPPLEMENTARY Note 11, wherein:

the tristate buffer further includes a transmission gate whose input terminal is connected to the output terminal of the second inverter and for which the setting of the conductive state and nonconductive state is implemented according to a control signal; and in a state in which the transmission gate has been placed in the nonconductive state, the second voltage is supplied to a predetermined switch element from among the plurality of first switch elements by way of the first programming transistor, and further, the second voltage is supplied to a predetermined switch element from among the plurality of second switch elements by way of the second programming transistor.

(SUPPLEMENTARY NOTE 13) The bidirectional buffer as described in SUPPLEMENTARY NOTE 12, wherein the withstand voltage of the transmission gate is equal to or greater than the second voltage.

(SUPPLEMENTARY NOTE 14) A reconfigurable circuit that includes:

the bidirectional buffer as described in any one of SUPPLEMENTARY NOTES 1 to 12;

a plurality of wires connected to the bidirectional buffer; and a plurality of programming transistors provided for each of the plurality of wires and having drain terminals connected to the wires.

(SUPPLEMENTARY NOTE 15) A control method of a bidirectional buffer that includes: a tristate buffer that supplies an input signal as output while buffering the input signal; a multiplexer whose output terminal is connected to an input terminal of the tristate buffer; a demultiplexer whose input terminal is connected to an output terminal of the tristate buffer; a first programming transistor whose drain terminal is connected to the input terminal of the tristate buffer; and a second programming transistor whose drain terminal is connected to the output terminal of the tristate buffer; wherein: the multiplexer is equipped with a plurality of input terminals and a plurality of first switch elements provided for each of the input terminals; the demultiplexer is equipped with a plurality of output terminals and a plurality of second switch elements provided for each of the output terminals; a conductive state and nonconductive state of each of the first and second switch elements can be programmably set according to supplied voltage, the immediately preceding set state being maintained when power supply is disconnected; at least two input terminals of the multiplexer are connected to at least two output terminals, respectively, of the demultiplexer; the connection wires between the input terminals and the output terminals are each connected to respectively different external wires; the control method comprising:

supplying a gate signal to the gate terminal of the first programming transistor to place the first programming transistor in the ON state, and supplying a programming voltage to the source terminal of the first programming transistor that has been placed in the ON state to place one switch element from among the plurality of first switch elements in the ON state; and supplying a gate signal to the gate terminal of the second programming transistor to place the second programming transistor in the ON state, and supplying the programming voltage to the source terminal of the second programming transistor that has been placed in the ON state to place at least one switch element from among the plurality of second switch elements in the ON state.

Although the present invention has been described hereinabove with reference to exemplary embodiments, the present invention is not limited to the above-described exemplary embodiments. The configuration and operation of the present invention is open to various modifications within a scope that does not diverge from the gist of the present invention that will be clear to one of ordinary skill in the art.

This application claims the benefits of priority based on Japanese Patent Application No. 2012-003071 for which application was submitted on Jan. 11, 2012 and incorporates by citation all of the disclosures of that application.

What is claimed is:

1. A bidirectional buffer comprising:
a tristate buffer that supplies an input signal as output while buffering said input signal;
a multiplexer whose output terminal is connected to an input terminal of said tristate buffer;
a demultiplexer whose input terminal is connected to an output terminal of said tristate buffer;
a first programming transistor whose drain terminal is connected to the input terminal of said tristate buffer; and
a second programming transistor whose drain terminal is connected to the output terminal of said tristate buffer;
wherein:
said multiplexer is equipped with a plurality of input terminals and a plurality of first switch elements provided for each of the input terminals;
said demultiplexer is equipped with a plurality of output terminals and a plurality of second switch elements provided for each of the output terminals;
at least two input terminals of said multiplexer are connected to at least two output terminals, respectively, of said demultiplexer, and the connection wires between the input terminals and the output terminals are connected to respectively different external wires;
a conductive state and nonconductive state of each of said first and second switch elements can be programmably set according to supplied voltage;
said first programming transistor switches between supplying and blocking of a supply of voltage to said plurality of first switch elements; and
said second programming transistor switches between supplying and blocking of a supply of voltage to said plurality of second switch elements.

2. The bidirectional buffer as set forth in claim 1, wherein:
said tristate buffer includes a logic circuit that operates at a first voltage and that supplies said input signal while buffering said input signal;
each of said first and second switch elements has two terminals, enters said conductive state when a second voltage that is greater than the value of said first voltage is applied across said two terminals for a predetermined time interval, and enters said nonconductive state when a reverse voltage whose direction is the reverse of the direction of the second voltage is applied for a predetermined time interval;
said first programming transistor switches between supplying and blocking of the supply of said second voltage and said reverse voltage to said plurality of first switch elements; and
said second programming transistor switches between supplying and blocking of the supply of said second voltage and said reverse voltage to said plurality of second switch elements.

3. The bidirectional buffer as set forth in claim 2, wherein:
said tristate buffer further includes first and second transmission gates in which setting of the conductive state and nonconductive state is carried out according to control signals;
said first transmission gate is provided at the input stage of said logic circuit;

said second transmission gate is provided at the output stage of said logic circuit; and
in a state in which each of said first and second transmission gates is set to said nonconductive state, said second voltage is supplied by way of said first programming transistor to one switch element from among said plurality of first switch elements, or said second voltage is supplied by way of said second programming transistor to at least one switch element from among said plurality of second switch elements.

4. The bidirectional buffer as set forth in claim 3, wherein:
each of said first and second transmission gates is each made up of an NMOS transistor and a PMOS transistor, the drain terminals of each being connected together, and moreover, the source terminals also being connected together;
said control signals include a first control signal and a second control signal in which the logic of the first control signal is inverted; and
said first control signal is supplied to the gate terminal of said NMOS transistor and said second control signal is supplied to the gate terminal of said PMOS transistor.

5. The bidirectional buffer as set forth in claim 4, wherein said tristate buffer further comprises an NMOS transistor for fixing logic value, its drain terminal being connected to an output terminal of said first transmission gate, its gate terminal being connected to a wire to which said second control signal is supplied, and its source terminal being grounded.

6. The bidirectional buffer as set forth in claim 4, wherein said tristate buffer further comprises a PMOS transistor for fixing logic value, its drain terminal being connected to an output terminal of said first transmission gate, its gate terminal being connected to a wire to which said first control signal is supplied, and its source terminal being grounded.

7. The bidirectional buffer as set forth in claim 2, wherein:
said tristate buffer further includes a first inverter provided in the input stage of said logic circuit, that has a withstand voltage equal to or greater than said second voltage, and that operates at said first voltage; and
the output terminal of said multiplexer is connected to the input terminal of said first inverter.

8. The bidirectional buffer as set forth in claim 7, wherein said logic circuit is made up of a second inverter whose input terminal is connected to the output terminal of said first inverter.

9. A reconfigurable circuit comprising:
the bidirectional buffer as set forth in claim 1;
a plurality of wires connected to said bidirectional buffer; and
a plurality of programming transistors provided for each of said plurality of wires and having drain terminals connected to the wires.

10. A control method of a bidirectional buffer includes: a tristate buffer that supplies an input signal as output while buffering said input signal; a multiplexer whose output terminal is connected to an input terminal of said tristate buffer; a demultiplexer whose input terminal is connected to an output terminal of said tristate buffer; a first programming transistor whose drain terminal is connected to the input terminal of said tristate buffer; and a second programming transistor whose drain terminal is connected to the output terminal of said tristate buffer; wherein: said multiplexer is equipped with a plurality of input terminals and a plurality of first switch elements provided for each of the input terminals; said demultiplexer is equipped with a plurality of output terminals and a plurality of second switch elements provided for each of the output terminals; a conductive state and nonconductive state of each of said first and second switch elements can be programmably set according to supplied voltage, the immediately preceding set state being maintained when power supply is disconnected; at least two input terminals of said multiplexer are connected to at least two output terminals, respectively, of said demultiplexer; the connection wires between the input terminals and the output terminals are each connected to respectively different external wires; said control method comprising:

supplying a gate signal to the gate terminal of said first programming transistor to place said first programming transistor in the ON state, and supplying a programming voltage to the source terminal of the first programming transistor that has been placed in the ON state to place one switch element from among said plurality of first switch elements in the ON state; and supplying a gate signal to the gate terminal of said second programming transistor to place said second programming transistor in the ON state, and supplying said programming voltage to the source terminal of the second programming transistor that has been placed in the ON state to place at least one switch element from among said plurality of second switch elements in the ON state.

* * * * *